(12) United States Patent
Bourhani et al.

(10) Patent No.: US 11,216,602 B2
(45) Date of Patent: Jan. 4, 2022

(54) MICRO FRONTENDS WITH MODEL-BASED STATE

(71) Applicant: Accenture Global Solutions Limited, Dublin (IE)

(72) Inventors: Milad Bourhani, Bologna (IT); Fabio Bucci, Bologna (IT); Marco Lazzarini, Rimini (IT)

(73) Assignee: Accenture Global Solutions Limited, Dublin (IE)

( * ) Notice: Subject to any disclaimer, the term of this patent is extended or adjusted under 35 U.S.C. 154(b) by 0 days.

(21) Appl. No.: 16/902,931

(22) Filed: Jun. 16, 2020

(65) Prior Publication Data
US 2021/0192106 A1    Jun. 24, 2021

Related U.S. Application Data

(60) Provisional application No. 62/951,214, filed on Dec. 20, 2019.

(51) Int. Cl.
*G06F 30/20* (2020.01)
*G06F 3/0482* (2013.01)
(Continued)

(52) U.S. Cl.
CPC ............ *G06F 30/20* (2020.01); *G06F 3/0482* (2013.01); *G06F 3/0483* (2013.01); *G06F 8/34* (2013.01); *G06F 8/35* (2013.01); *G06F 3/048* (2013.01)

(58) Field of Classification Search
CPC ... G06F 30/20; G06F 8/34; G06F 8/35; G06F 3/0482; G06F 3/0483; G06F 3/0486; G06F 2111/20
See application file for complete search history.

(56) References Cited

U.S. PATENT DOCUMENTS 5,845,299 A * 12/1998 Arora .................... G06F 40/117
715/209
10,678,600 B1 * 6/2020 Darling .................... G06F 8/70
(Continued)

FOREIGN PATENT DOCUMENTS

EP    3153966    * 12/2017

OTHER PUBLICATIONS

"Micro Frontends", Cam Jackson, Jun. 19, 2019 available at web.archive.org/web/20191206204701/https://martinfowler.com/articles/micro-frontends.html archives Dec. 6, 2019.*
(Continued)

*Primary Examiner* — Matthew Ell
(74) *Attorney, Agent, or Firm* — Fish & Richardson P.C.

(57) ABSTRACT

This document describes a computing architecture that enables users to develop applications using building blocks that include micro frontends. In one aspect, a method includes providing a configuration user interface that enables a user to select and arrange building block user interface elements in a layout for a page. Data specifying a layout of one or more building block user interface elements that each include a micro frontend and corresponding back-end logic is received from the configuration user interface. Each micro frontend includes one or more user interface components and a store that manages a model that represents a state of the one or more user interface components of the micro frontend. The corresponding backend for each micro frontend includes a function that updates the model of the micro frontend based on a previous model of the micro frontend and an action. User interface data is generated.

21 Claims, 11 Drawing Sheets

(51) Int. Cl.
*G06F 3/0483* (2013.01)
*G06F 8/34* (2018.01)
*G06F 8/35* (2018.01)
*G06F 3/0486* (2013.01)
*G06F 3/048* (2013.01)

(56) References Cited

U.S. PATENT DOCUMENTS

| | | | | |
|---|---|---|---|---|
| 2007/0265929 | A1* | 11/2007 | Danninger | G06F 3/0483 705/26.1 |
| 2007/0266329 | A1 | 11/2007 | Gaudette | |
| 2012/0133662 | A1* | 5/2012 | Morris | G06F 3/0481 345/581 |
| 2014/0258841 | A1* | 9/2014 | Strong | G06F 16/986 715/234 |
| 2017/0139404 | A1* | 5/2017 | Anand | G06F 8/34 |
| 2018/0081639 | A1 | 3/2018 | Collins | |
| 2019/0114057 | A1* | 4/2019 | Kerr | G06F 3/04845 |
| 2019/0266226 | A1* | 8/2019 | Kirn | G06F 40/14 |

OTHER PUBLICATIONS

"The Fundamentals of Redux", Hamza Firoz, Jan. 15, 2019 available at https://dzone.com/articles/basic-fundamentals-of-redux hereinafter "Firoz".*

"Actions", available at web.archive.org/web/20190817190911/https://redux.js.org/basics/actions archived Aug. 17, 2019.*

"A Redux-Inspired Backend", Roman Eremin, Jan. 14, 2019, available at https://medium.com/resolvejs/resolve-redux-backend-ebcfc79bbbea.*

Knockout: Observables available at https://knockoutjs.com/documentation/observables.html archived Jul. 24, 2019 hereinafter "Knockout".*

Knockoutjs.com [online], "The Data-Bind Syntax," available on or before Nov. 1, 2012, via Internet Archive: Wayback Machine URL<https://web.archive.org/web/20121101001455/https://knockoutjs.com/documentation/binding-syntax.html>, retrieved on Jun. 29, 2020, retrieved from URL <https://knockoutjs.com/documentation/binding-syntax.html>, 2 pages.

Micro-frontends.org [online], "MicroFrontends—Extending the Microservice Idea to Frontend Development," available on or before Jul. 14, 2017, via Internet Archive: Wayback Machine URL<https://web.archive.org/web/20170714110711/https://micro-frontends.org/>, retrieved on Jun. 29, 2020, retrieved from URL <https://micro-frontends.org/, 6 pages.

Microservices.io [online], "Microservice Architecture," Mar. 18, 2014, last updated Jun. 2, 2020, retrieved on Jun. 29, 2020, retrieved from URL<https://microservices.io/>, 12 pages.

Redux.js.org [online], "Data Flow," available on or before May 7, 2018, via Internet Archive: Wayback Machine URL<https://web.archive.org/web/20180507230704/https://redux.js.org/basics/data-flow>, retrieved on Jun. 29, 2020, retrieved from URL <https://redux.js.org/basics/data-flow>, 5 pages.

Wikipedia.org [online], "Actor Model," last updated Jun. 19, 2020, retrieved on Jun. 29, 2020, retrieved from URL <https://en.wikipedia.org/wiki/Actor_model>, 21 pages.

EP Extended Search Report in European Appln. No. 20215235.1, dated Apr. 23, 2021, 10 pages.

* cited by examiner

MICRO FRONTENDS WITH MODEL-BASED STATE

CROSS REFERENCE TO RELATED APPLICATIONS

This application claims the benefit under 35 U.S.C. § 119(e) of U.S. Patent Application No. 62/951,214, titled "MICRO FRONTENDS WITH MODEL-BASED STATE, filed Dec. 20, 2019, which is hereby incorporated in reference in its entirety.

TECHNICAL FIELD

This specification relates to a computing architecture that enables users to develop applications using building blocks that include micro frontends.

BACKGROUND

Software developers often attempt to develop software components that can be reused to build new software. This can save time and reduce errors and testing time for the new software applications. One example of such reuse is a microservice architecture that structures applications as a group of services that can each be reused in other applications. Another example of reuse is a micro frontend architecture that structures user interfaces as a group of frontend components that can be reused in other user interfaces of other applications.

SUMMARY

This specification generally describes a computing architecture that enables users to develop applications using building block user interface elements ("building blocks") that include micro frontends that have a model-based state. A micro frontend can be in the form of one or more frontend components that can be included in a page, e.g., a web page or application page. Each micro frontend can have its own independent backend, e.g., in the form of a microservice, that is part of a building block, e.g., a business component, that includes the micro frontend. In this way, independent teams can develop building blocks that can be inserted into multiple user interfaces, e.g., multiple pages.

The backend for a micro frontend can be connected to the user interface components of the micro fronted using declarative bindings, e.g., using JavaScript Object Notation (JSON). The use of declarative bindings enables the user interface components to be decoupled from the physical backend implementation and enables decoupling from specific user interface technologies. In this way, the user interface can optimize the rendering on specific user interface technologies. The micro frontends of a user interface can also be connected using declarative bindings that enable the micro frontends to communicate, e.g., using messages that include actions.

A micro frontend can include a globally-managed model-based state that is changed based on actions received from the user interface or another micro frontend. For example, a micro frontend can include a global store, which can be implemented on the frontend, that manages the state for the micro frontend. The state can represent the micro frontend's model. When the micro frontend receives an action, e.g., based on user interaction with the user interface component or an action received from another micro frontend, the store can send the action to the backend. The backend can include one or more reducers that generates an updated model, e.g., without changing the model, based on the action and the previous model and sends the updated model to the store. Thus, rather than being mutated, an immutable model is threaded through the reducer function(s), which yields the new, immutable version of the model for the store. This model-based approach fits well as a distributed and concurrent computation paradigm at a larger scale where actors achieve a distrusted computation by exchanging messages and encapsulating their state. This also enables business components, which can be a combination of one or more micro frontends with a corresponding backend, to be location transparent, which means that a single page in an application can be composed by business components running on distinct servers. Inside of each actor, e.g., each business component, the state management enables stateless computation to be predictable, parallelized, and horizontally scalable.

In general, one innovative aspect of the subject matter described in this specification can be embodied in methods that include providing a configuration user interface that enables a user to select and arrange building block user interface elements in a layout for a page; receiving, from the configuration user interface, data specifying a layout of one or more building block user interface elements that each include a micro frontend and corresponding backend logic, wherein: each micro frontend includes one or more user interface components and a store that manages a model that represents a state of the one or more user interface components of the micro frontend; and the corresponding backend for each micro frontend includes a function that updates the model of the micro frontend based on a previous model of the micro frontend and an action; and generating user interface data that, when processed by an application, causes the application to generate a user interface that presents the one or more user interface components of each of the one or more building block user interface elements in the layout specified by the received data. Other implementations of this aspect include corresponding systems, apparatus, and computer programs, configured to perform the actions of the methods, encoded on computer storage devices.

These and other implementations can each optionally include one or more of the following features. Some aspects can include receiving data specifying that a first building block user interface element is a subscriber to messages generated by a second building block user interface element and generating a declarative binding between the first building block user interface element and the second building block user interface element.

In some aspects, the backend of each building block user interface element includes one or more reducer functions. A given user interface component of each building block user interface element can include an action that is bound to a corresponding reducer function of the backend of the building block user interface element. The store of each micro frontend can be configured to send a current model maintained by the store and action data specifying a detected action to the corresponding reducer function in response to detecting the action. Each reducer function can be configured to generate an updated model based on the received current model and action data and provide the updated model to the store.

In some aspects, each of the one or more user interface components is bound to a respective attribute of the model. Some aspects can include updating the one or more user interface components in response to receiving an updated model that includes updated attributes. Some aspects can include receiving data defining custom business logic for the user interface.

The subject matter described in this specification can be implemented in particular embodiments and may result in one or more of the following advantages. Using the actor-like paradigm for communication between business components that is based on asynchronous message passing not only enables local transparency—e.g., different business components on a single page can run on physically different back-ends—but also enables temporal decoupling such that a receiving business component does not need to be in any way active and listening for messages. Instead, the business component is activated by the architecture on demand. In addition, the sending business component does not need to wait for the message to be processed, both of which enables better resource utilization and more efficient communication.

The interplay between model-based state, declarative configuration and composition, and vertical reuse and encapsulation provided by business components and other building blocks described in this document allows component and toolkit developers to safely define business logic within well-defined physical and logical perimeters, enables app developers to leverage a substantial amount of pre-built, tested, and vertical building blocks that speak their same business language, and lets designers draw from the thinking and user experience that inspired and were infused in the whole platform, from the most basic user interface components to declarative layouts and page navigation. The architecture can be used to enable developers to quickly create reusable applications with no-code and/or low-code approaches and to build and allow the building of reusable vertical toolkits that contain a set of building blocks, e.g., a set of building blocks for a particular team of developers that are typical for that team's business context. Using such building blocks reduces errors introduced by regenerating similar micro frontends for each application, rather than using pre-tested building blocks.

BRIEF DESCRIPTION OF THE DRAWINGS

Like reference numbers and designations in the various drawings indicate like elements.

DETAILED DESCRIPTION

Figure 1:
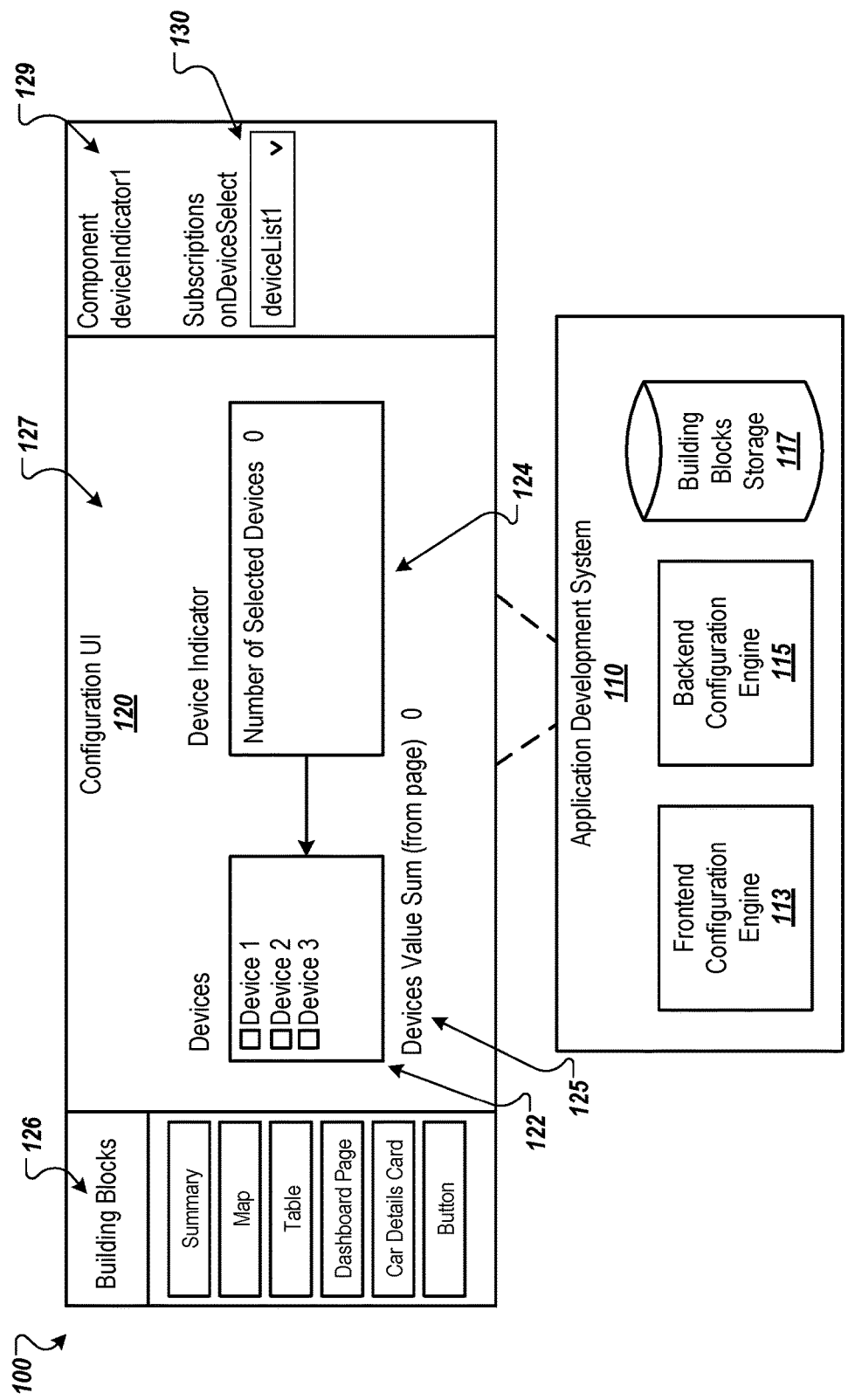
FIG. 1 is a block diagram of an example environment in which an application development system enables a user to develop an application using building blocks that include micro frontends.

FIG. 1 is a block diagram of an example environment 100 in which an application development system 110 enables a user to develop an application using building block user interface elements ("building blocks") that include micro frontends. The application development system 110 includes a frontend configuration engine 113, a backend configuration engine 115, and a building blocks data storage device 117 that store building blocks.

The frontend configuration engine 113 enables users, e.g., application developers, to generate a frontend of an application, e.g., one or more pages or other user interfaces of the application using a configuration user interface 120. For example, the frontend configuration engine 113 can enable a user to generate web pages, application pages of native applications developed for particular platforms or devices, or other computer-generated user interfaces. For ease of subsequent description, the application development system 110 will be described largely in terms of "pages," which can refer to any of these types of user interfaces.

A user can create a page by adding building blocks to an editor page 127 of the user configuration interface 120. In this example, the configuration user interface 120 includes a menu 126 of configured building blocks that the user can select and place in the editor page 127 of the configuration user interface 120. For example, a user can drag and drop a building block from the menu 126 to the editor page 127. The user can arrange the building blocks within the editor page 127 to configure the layout for the user interface. For example, the location of a building block within the user interface can represent the actual location of a user interface component generated and presented within the page when the configured page is presented on a user device, e.g., when a configured web page is presented in a web browser running on a user device.

Each building block can include a micro frontend and a corresponding independent backend component. A micro frontend can be in the form of one or more frontend components that are presented within a page that includes the micro front end. For example, a micro frontend can include one or more images (or image presentation components in which an image is selected and presented), buttons, icons, slider controls, selector lists, dropdown menus, etc.

The backend of a building block can be in the form of a microservice or other business logic. In some implementations, the backend of a building block includes one or more functions, e.g., one or more reducer functions, that update a model of the frontend based on data specifying an action received from the micro frontend. Importantly, the building blocks can have different types of backends, e.g., with logic or code that runs on different platforms. For example, the backend of a building block for a button may be a microservice programmed using a first programming language that runs on a first server and the backend of a building block for presenting images may be a microservice programmed using a second programming language different from the first programming language and that runs on a second server different from the first server. In this way, independent teams can develop building blocks that can be inserted into multiple user interfaces, e.g., multiple pages.

The backend for a micro frontend can be connected to the user interface components of the micro fronted using declarative bindings, e.g., using JSON. The micro frontends of a user interface can also be connected to each other using declarative bindings that enable the micro frontends to communicate, e.g., using messages that include actions, as described in more detail below.

A micro frontend of a building block can include a globally-managed model-based state that is changed based on actions. The action can be in the form of a user interaction with the frontend component(s) of the micro frontend, a message from another micro frontend, or a message from the page that includes the micro frontend. Each micro frontend can include a global store, which can be implemented on the frontend (e.g., as code of a web page or native application), that maintains and manages the state for the micro frontend. The state can represent the micro frontend's model. When the micro frontend receives an action, the store can send data specifying the action to the backend corresponding to the micro frontend. The backend can include one or more functions, e.g., reducer functions, that receives the model and the data specifying the action and generates an updated model based on the action and the received model. The reducer function(s) can generate the updated model without changing the model itself.

The model describes the state of the user interface components of the micro frontend. The model defines how the user interface elements are displayed and how actions (e.g., user interactions with the user interface elements, another micro frontend, or another user interface component) impact the business logic and thereby updates the user interface components of the micro frontend. For example, in a page where devices are selected among a list of possible devices, a user interface component of the micro frontend would need to represent the list (e.g., in the form of a drop down menu) and enable the user viewing the page to select one or more of the devices from the list.

One example way of implementing this would be a model that includes a list of devices (e.g., their stock-keeping units (SKUs)) represented as strings and a list among this list which have been selected by the user which may also be represented as strings. The relationship between the list of devices displayed by the user interface component and the business logic of the backend can be established using declarative bindings on the page configuration. For example, if JSON is used, this relationship can be specified as "choices: ${possibleDevices}". The correlation between the user selecting the devices and the corresponding population of these values can be implemented by the inner workings on the client, driven by the bindings configuration for the page. For example, if JSON is used, the correlation can be defined by "selected: ${selectedDevices}", where "selectedDevices" is the name of the model field in the model of the building block. If JSON is used, the model at any given time may be in the form of:

{
"possibleDevices": ["Dev42", "Dev43"],
"selectedDevices": ["Dev42"]
}

In this example, the model maintains the current state of the micro frontend by specifying the devices included in the list of devices and the currently selected devices using two model parameters, the "possibleDevices" list and the "selectedDevices" list. When an action is detected, the micro frontend can pass the current model to a reducer function on the backend along with data specifying the action. The reducer function can generate an updated model based on the action and provide the updated model back to the micro frontend and the micro frontend can update the user interface components based on the action. For example, if the user selects "Dev43" from a drop down menu that includes all of the devices in the list of devices, the micro front end can send the model that specifies the current state of both lists and data specifying that "Dev43" has been selected. In response, the backend can use a reducer function to update the model. This reducer function can be configured to update the "selectedDevices" list to specify the current list of selected devices, e.g., to include "Dev42" and "Dev43" in response to the user's selection of "Dev43." The backend can provide the updated model including the two lists to the micro frontend. In turn, the micro frontend can use the updated lists to update the drop down menu to show that both "Dev42" and "Dev43" have been selected.

The building blocks can include multiple types of building blocks. One type of building block is an individual user interface component, such as a button, icon, graphic, etc. The user interface component can include a single frontend component in the form of a micro frontend, a corresponding backend, and a model for the frontend component. These user interface components can be context and application agnostic.

Another type of building block is a card. A card can include groups of user interface component building blocks organized into a layout. For example, a user can define an arrangement of multiple user interface components that can be included in a page or other user interface. The user can also configure the communications between the user interface components in a similar way as a user would configure communications between individual building blocks, as described below. In this way, a user can place a card on a page and the card will be displayed on that page in the layout defined by the user. In addition, the user would not have to configure the layout or communication between the user interface components of the card. This makes it easier and more efficient for groups or layouts of user interface components that will be reused with different pages.

Another type of building block is a business component. A business component is a set of user interface component building blocks and/or cards in a particular layout, e.g., a user-defined layout, and backend business logic. The backend business logic can include one or more reducer functions that change the state of a micro frontend based on a previous state of the micro frontend and an action. For example, a map business component can present a map of a geographic area. If a user zooms in or out of the map (e.g., the action), the reducer function can update the map based on the geographic area previously shown by the map (e.g., the previous state) and the zoom action. The business components can be context-aware and application-agnostic. For example, a business component can forecast metrics and can be used in multiple different applications.

Another type of building block is a page. A page is a layout of one or more user interface component building blocks, one or more cards, and/or one or more business components. Like the cards and business components, the layout of the page can be defined by a user. A page can also include backend business logic, e.g., application-specific business logic, in the form of one or more reducer functions. Each business component can also have its own backend business logic, as described above. The page and each business component on the page can have its own independent backend business logic that the business component or page is connected to using declarative bindings, e.g., JSON declarative bindings.

Unlike business components, a page can be context-aware and application-aware. For example, a page can be a custom web application. In a particular example, a page can include a forecasting reporting dashboard for a particular web application. Similar to business components, the pages can interact with one another. However, pages may interact with one another using navigation rather than subscriptions. For example, one page can pass parameters to another page during navigation. For web pages, the parameters can be Uniform Resource Locator (URL) parameters that are passed to the next page when the web browser navigates from the previous page to the next page.

In some implementations, the business components are building blocks that have the same frontend and backend aspects for each user interface in which they are included. In other words, the application development system 110 may not allow users to directly modify the frontend or backend aspects (e.g., the reducer functions) of the building blocks. However, the pages can enable the configuration of business components indirectly by including business logic in the page that can send messages to and receive message from the business components or other building blocks. In addition, although the business components are closed from modification of the frontend and backend, a user that develops a business component or other type of building block can include configurable options that allow users to configure some aspects of the frontend and/or backend aspects of the business component or other type of building block.

The user interface components, cards, business components and/or pages can be configured via JSON, making them editor friendly. The JSON elements can be extracted and re-used in other components, making the elements reusable with little or no changes to the code. The JSON elements also enable declarative bindings between user interface components, cards, and business components.

The business components can include micro frontends on the user interface and business logic, e.g., vertical business logic, on the backend. Thus, the business components include both the frontend and backend functionality that can simply be dragged and dropped into the configuration of a page without modifying code. Having the business logic on the backend allows for better security relative to having business logic on the frontend and also allows for a polyglot architecture in which the backends can be configured using different programming languages and software platforms.

Users can generate building blocks, test the building blocks, and add the building blocks to the building blocks building blocks data storage device 117. The application development system 110 can add the building blocks to the building blocks menu 126. A user can generate a page by adding building blocks to the editor page 127, e.g., by dragging and dropping the building blocks from the building blocks menu 126.

The user can configure the micro frontends on a page to communicate with one another and/or with business logic of the page itself. For example, the user can connect multiple building blocks together using lines within the editor page 127 so that the building blocks can communicate with each other. For example, when the user connects two building blocks, the frontend configuration engine 113 can generate declarative bindings between the micro frontends of the building blocks, which can subscribe a micro frontend to receive messages from another micro frontend. In some implementations, the frontend configuration engine 113 can generate the connections between micro frontends automatically, e.g., based on preconfigured communications for groups of one or more micro frontends. For example, one building block may allow a user to make a selection and a corresponding building block can present content based on the selection. In this example, the corresponding building block may be preconfigured to subscribe to message sent by the one building block.

In this example, the user has placed two sample business components on the editor page 127. The sample business components are a "Device List" business component 122 and a "Device Indicator" business component 124. When presented on a page, the "Device List" business component 122 enables end users to select devices from a list of devices and, in response, sends messages of type "OnDeviceSelect" to any business component or other building block on the page that are subscribed to receive "OnDeviceSelect messages, or to the page that includes the "Device List" business component 122. The "OnDeviceSelect" message indicates the set of devices that were selected by the end user in the "Device List" business component 122. For example, if the user selects "Device 1" in the "Device List" business component 122 when presented on a web page or application page, the "Device List" business component 122 can send a message to the subscribed building blocks and/or to the business logic of the web page or application page. This message can indicate that "Device 1" has been selected or can indicate all of the devices that are currently selected.

The "Device Indicator" business component 124 can receive these messages and, in response to receiving the message, the "Device Indicator" business component 124 displays the number of selected devices on its user interface component.

The user is able to drag and drop the business components 122 and 124 onto the editor page 127 from the building blocks menu 126. The user can also arrange the business components 124 in a desired layout within the editor page 127 which corresponds to the layout of the business components 124 on an end user device when the user interface that includes the business components is presented by the user device.

The configuration user interface 120 also includes a component communication area 129 at which a user can configure the communications between building blocks on a page. In this example, the user is configuring the communications for an instance of the "Device Indicator" business component, i.e., "deviceIndicator1." The user has specified that the "deviceIndicator1" business component is to receive the "onDeviceSelect" messages from an instance of the "Device List" business component 122, i.e., "deviceList1." For example, the user can select the business components from which the "Device Indicator" business component 124 will receive messages using a drop down menu 130, or other type of user interface control. This wiring operation between the two business components 122 and 124 also enables the user to select the specific instance of the "Device List" business component 122 from which to receive the messages as there could be multiple instances of a same business component on a single page.

The page also includes a "Device Values Sum" user interface component 125 that presents a sum for the selected devices that are selected using the "Device List" business component 122. Each device in the "Device List" business component 122 can have an associated parameter, such as a number of alarms triggered for the device, an estimated kilometers before refueling a vehicle (e.g., if the devices represent vehicles), or another parameter. The "Device Values Sum" user interface component 125 can present, as the sum, an attribute of a model maintained by the page. The user can bind the action of the "Device List" business component 122 to a reducer function on the backend business logic of the page.

When a user selects a device or deselects a device in the "Device List" business component 122 when it is presented at a user device, the "Device List" business component 122 can send a message to each subscriber, including the business logic of the page that is bound to the "DeviceList" business component 122. The reducer function can update a model for the page that includes the attribute for the "Device Values Sum" user interface component 125. For example, the reducer function can update the model based on the currently selected devices in the "DeviceList" business component 122 indicated in the message. The reducer function can also update the attribute by adding the values of the parameters of each selected device to determine the sum of those parameters. In this way, when the action occurs, the reducer function can update the model and thus, the attribute, and the "Device Values Sum" user interface component 125 can present the updated attribute without direct interaction between the "Device Values Sum" user interface component 125 and the "Device List" business component 122. This is an example of how the business logic of the page can be customized to provide functionality of the overall frontend represented by the page without modifying the code of any of the building blocks.

Using declarative bindings, on the producer side, components can declare the fact that their instances might emit messages of a given type, which are specific to the component type. In this example, the "Device List" component will declare that, when the user selects a device on the screen, the component will raise a message of type "onDeviceSelect" and that the message will also carry a message-specific payload containing the information needed to understand and consume the message. In this example, the payload would be the device currently being selected (i.e., clicked on the UI).

On the consumer side, the receiving components ("Device Indicator") will declare the fact that their instances can receive messages coming from instances of the producing component ("Device List"). An example of the relevant JSON configuration of the receiving component, the "Device Indicator" may be:

"subscriptions": {
 "onDeviceSelect": "${countDevices}"
}

In this example, "countDevices" is a reducer function that resides in the component's backend (e.g., the building block's backend) implementation (e.g., not in the page's implementation). This configuration will be shipped along with the component and is therefore static in nature—i.e., it will not be part of the page configuration, which is instead dynamic and controlled by the application developer.

Since there can be multiple instances of both the producer and consumer components on a given page ("Device List" and "Device Indicator", respectively), the application developer can specify the point-to-point wiring between these component instances in the page JSON configuration. This configuration can be in the form of:

"deviceIndicator1": {
"type": "DeviceIndicator",
"subscribedTo": "onDeviceSelect": "deviceList1"
}

In this example, "deviceIndicator1" and "deviceList1" indicate the specific instances of the "Device List" and "Device Indicator" component types, respectively. This is an example of the declarative binding between the "Device List" component and the "Device Indicator" that would be generated by the front-end configuration engine 113.

The backend configuration engine 115 enables users to configure backend functionality, e.g., business logic, for the application and the user interfaces of the application. For example, the backend configuration engine 115 can enable the users to generate custom business logic for a page that includes one or more building blocks 126. This configuration is optional for many pages as the building blocks 126 include their own backends that are either no code (e.g., no code needs to be configured for the backend) or low code (e.g., a minimal amount of code can be configured to customize the backend functionality).

After a user has finished arranging building blocks on the editor page 127, the application development system 110 can generate user interface data that, when processed by an application, generates a user interface that presents one or more user interface components of each of the building blocks arranged on the editor page 127. For example, the user interface data can be loaded onto the application for which the user interface is being developed and, in response, the application can be present the user interface that includes the user interface components of the building blocks.

In some implementations, each building block will include UI-specific code (e.g., HTML and JavaScript), that implements that component's view on the client. When the component represented by the building block is generated for presentation on a screen, the application (e.g., web browser) can draw the component on the screen, read the fields bindings to correctly display business-specific information, and read the action bindings to correctly react to actions coming from the UI elements and translate them to invocations of the designated back-end reducer functions.

The communication between the micro frontends of the can use actor-like inter-communication using messages such that no internal state is exposed. For example, a first micro frontend can send a message that specifies an action to a second micro frontend without having to share state information. Each micro frontend can maintain its own state using a store, as described in more detail below.

The backend of the business components can embody vertical, context-specific, application-agnostic business logic. This can maximize reuse of the business logic by implementing and centralizing recurring vertical patterns.

As described above, a micro frontend can be in the form of one or more frontend components that can be included in a page and each micro frontend can have its own independent backend. In this way, independent teams can develop business components that can be inserted into multiple user interfaces, e.g., multiple pages. This allows for multiple teams to independently work on business components that will be included in the same user interface. For example, a first team can develop the "Device List" business component 122 and a second team can develop the "Device Indicator" business component 124. Each team can also generate groups of reusable building blocks specific to their team's applications or business context.

As the business components are independent from each other, the user interfaces that include the business components can render the business components in parallel. This can improve user interface performance and responsiveness, and reduce the latency in presenting the user interfaces. As some business components may be subscribed to other business component's messages, the subscriber may be rendered after the business component to which it subscribes is rendered, in some implementations.

Figure 2:
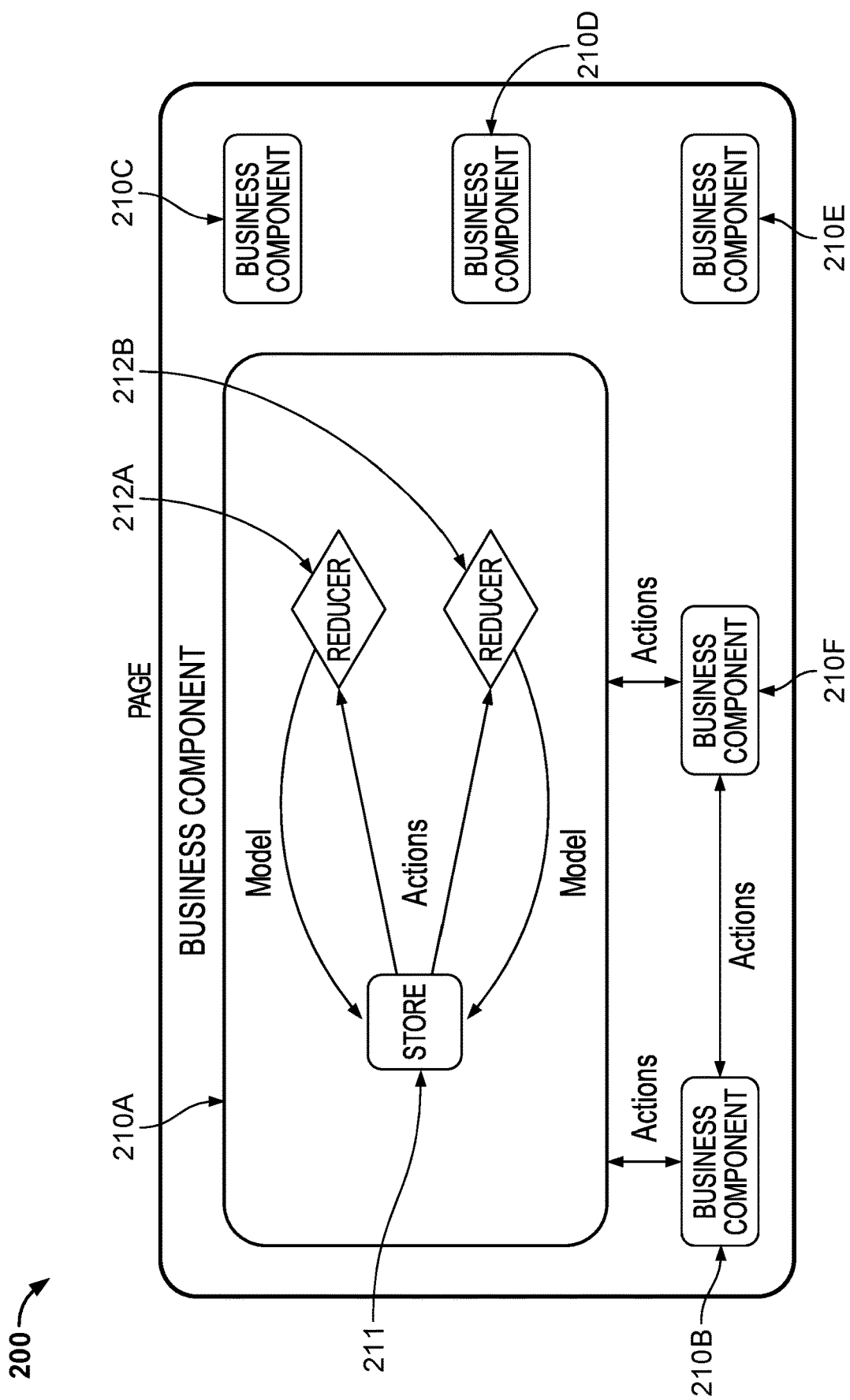
FIG. 2 is a diagram illustrating components of an example page of an application.

FIG. 2 is a diagram illustrating components of an example page 200 of an application. The page 200 includes multiple business components 210A-210F. Although only shown for the business component 210A, each business component 210A-210F includes a store 211 and one or more reducer functions 212A and 212B. The store 211 manages the state of the model for the business component. The state represents the micro frontend's model and is the single source of the truth for the micro frontend. The store 211 can be implemented in various ways depending on the technology selected for the user interface on the client. For example, if JavaScript is used (e.g., ReactJS), the store 211 can be implemented using a state container (e.g., Redux).

Each reducer function 212A and 212B can generate an updated model based on the previous model and an action. For example, if the business component 210A is a button that can be in one of two states, the reducer function for the button can update the state from its current state to the other state in response to the button being pressed. When the button is pressed, the store 211 can send the action (e.g., a message indicating that the button has been pressed) to the appropriate reducer function 212A or 212B. The reducer function can determine the updated model based on the previous model and the action.

The business components can communicate with one another using messages. For example, when two business components are connected using the configuration user interface 120 of FIG. 1, the application development system 110 can subscribe the business components to receive messages from each other (or just one from the other), as described above. The messages can include actions appropriate for the business component to which the message is sent. For example, the user interface component(s) of a first business component can be updated based on a user interaction with a user interface component of a second business component, by having the second business component send a message with the action (e.g., that specifies the user interaction) to the first business component in response to detecting the interaction. When receiving the message, the micro frontend of the first business component will then send the action along with the current state (e.g., the current model) of the first business component to its backend, receive the updated state from the reducer function, and update its user interface component based on the updated state.

Figure 3:
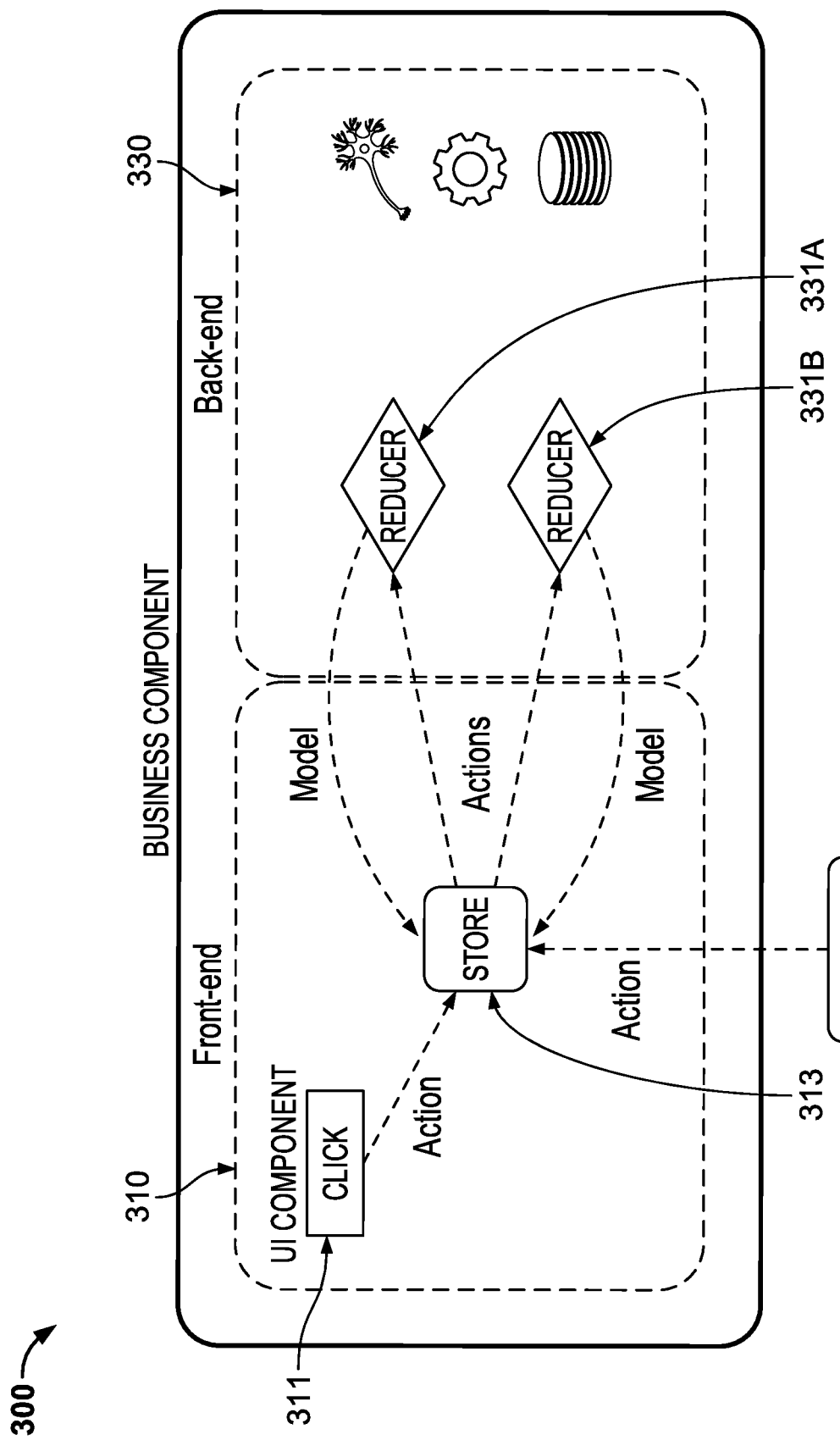
FIG. 3 is a diagram illustrating components of an example business component.

FIG. 3 is a diagram illustrating components of an example business component 300. The business component 300 includes a frontend 310 and a backend 330. The frontend 310 can be implemented as a micro frontend that includes a user interface component 311, e.g., a click button in this example, and a store 313 that manages the state of the user interface component 311.

The backend includes reducer functions 331A and 331B. Each reducer function 331A and 331B can be associated with different types of interactions with the button. For example, the reducer function 331A can be associated with a selection (e.g., a click) of the button and the reducer function 331B can be associated with a hover over the button. The developer of the business component 300 can bind a selection action to the reducer function 331A and can bind a hover action to the reducer function 331B. In this example, the button supports two types of actions. Other business components can support only one action (e.g., with one corresponding reducer function) or multiple actions (e.g., each with a corresponding reducer function).

When the button is selected (e.g., clicked) at a user interface presenting the button, the button provides action data indicating the selected action to the store 313. In turn, the store 313 provides the action data and the current model that represents the current state of the button to the reducer function 331A based on the binding between the selection action and the reducer function 331A. The reducer function 331A determines an updated model based on the action data and the current model and sends the updated model to the store 313. A similar sequence can occur for a hover action, except that the action data would be sent to the reducer function 331B which would generate an updated model based on the action data and the current model.

Figure 4:
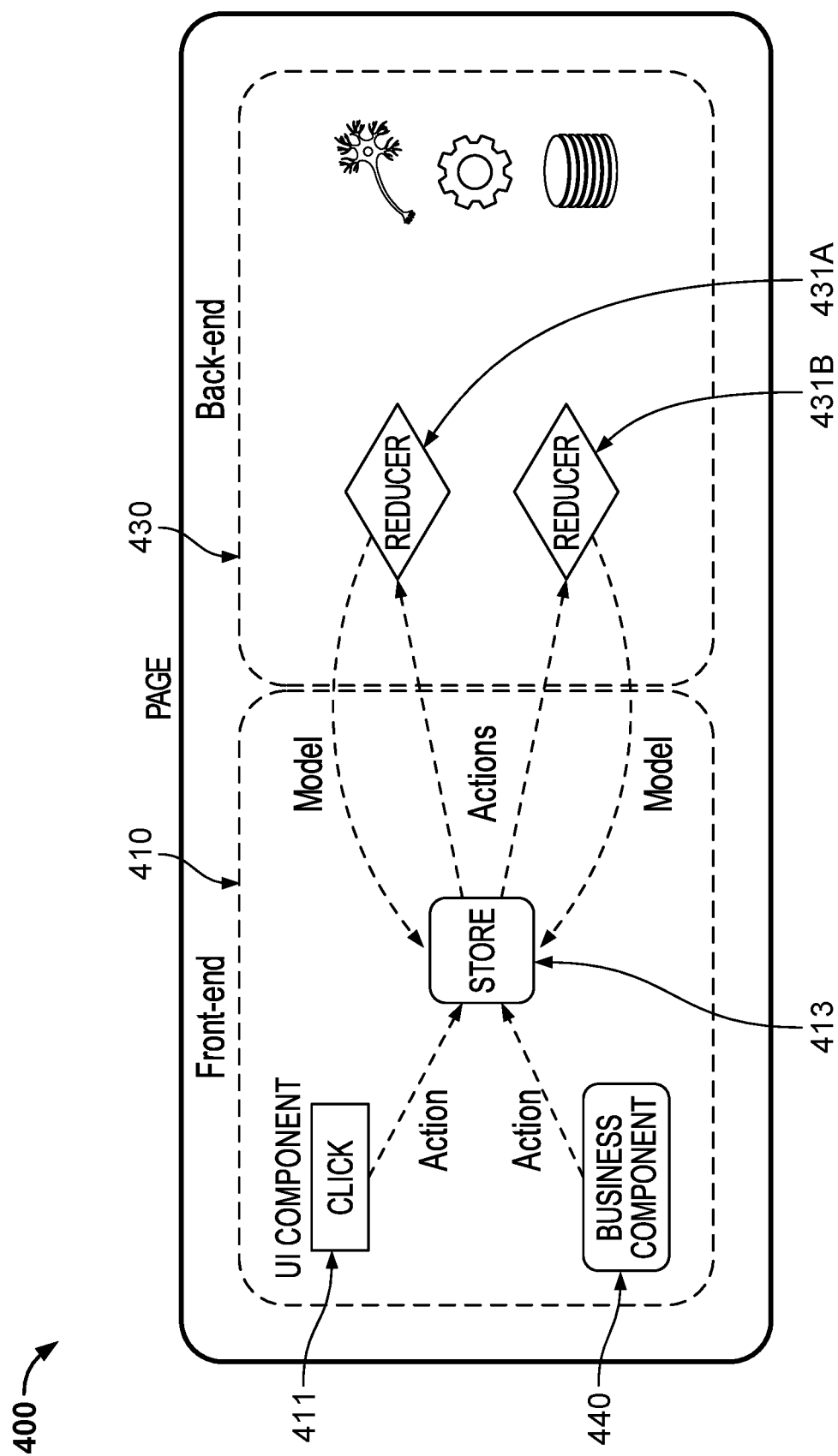
FIG. 4 is a diagram illustrating components of another example page of an application.

FIG. 4 is a diagram illustrating components of another example page 400 of an application. The page 400 includes a frontend 410, e.g., a micro frontend, and a backend 430 that includes reducer functions 431A and 431B for the page 400. The frontend 410 of the page 400 includes a user interface component 411, e.g., a button, a store 413 that manages the state of the page 400, and a business component 440. The page 400 can include multiple business components, user interface components, and/or cards. The store 413 of the page 400 can communicate with basic user interface components (e.g., the button) and business components, e.g., the business component 440 using messages that specify actions, similar to how business components on a page communicate with each other.

In this example, when the button is pressed, the button provides, to the store 413, action data specifying that the button has been pressed and the store 413 can send the action data to the reducer function, e.g., the reducer function that is bound to the button's action. Similarly, the business component 440 can provide, to the store 413, action data specifying an action that occurred with respect to the business component 440. Thus, a page can handle actions coming from both basic user interface components and business components in a transparent way. For example, the application developer may not even know the difference between the two types of building blocks. From a coding perspective, both building blocks generate action data that is handled by page reducer functions on the backend, which can generate updates models for the page 400 in a similar manner as the reducer functions of business components (e.g., by generating an updated model for the page based on a current model for the page and the action data).

The business component 440 can have one or more attributes that are presented by user interface components of the business component 440 and that are bound to the model of the page 400. When the button is selected, the button can provide action data specifying the selection to the store 413. In turn, the store 413 can provide the action data and the current model to the reducer function 431A bound to the button. The reducer function 413A can generate an updated model based on the action data and the current model and provide the updated model to the store 413. As the attributes of the business component are bound to the model, the store 413 can send a message to the business component 440 with the attributes in the updated model. In turn, the business component can update the user interface components to present the updated attributes.

The application development system 110 can configure subscriptions between the store 413 of a page 400 and business components 440 on the page 400 similar to how subscriptions are configured for messaging between business components.

Figure 5:
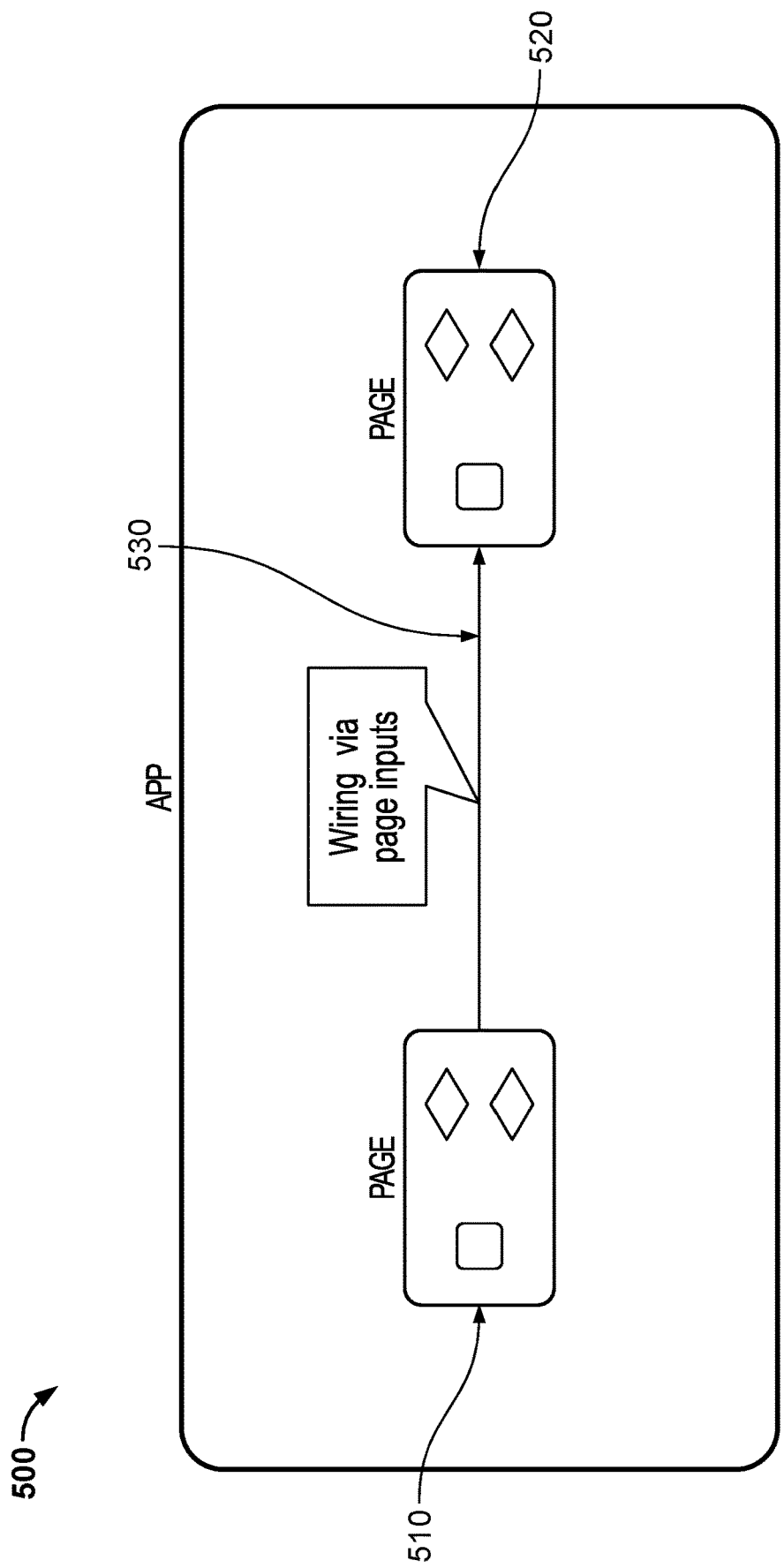
FIG. 5 is a diagram illustrating a connection between pages of an application.

FIG. 5 is a diagram illustrating a connection between pages 510 and 520 of an application 500. The pages 510 can communicate with one another using page inputs 530 when the application 500 navigates from one page to another. For example, rather than using messaging, the page 510 can provide, as page inputs 530, parameters to the page 520. For web pages, the parameters can be URL parameters, as described above.

Figure 6A:
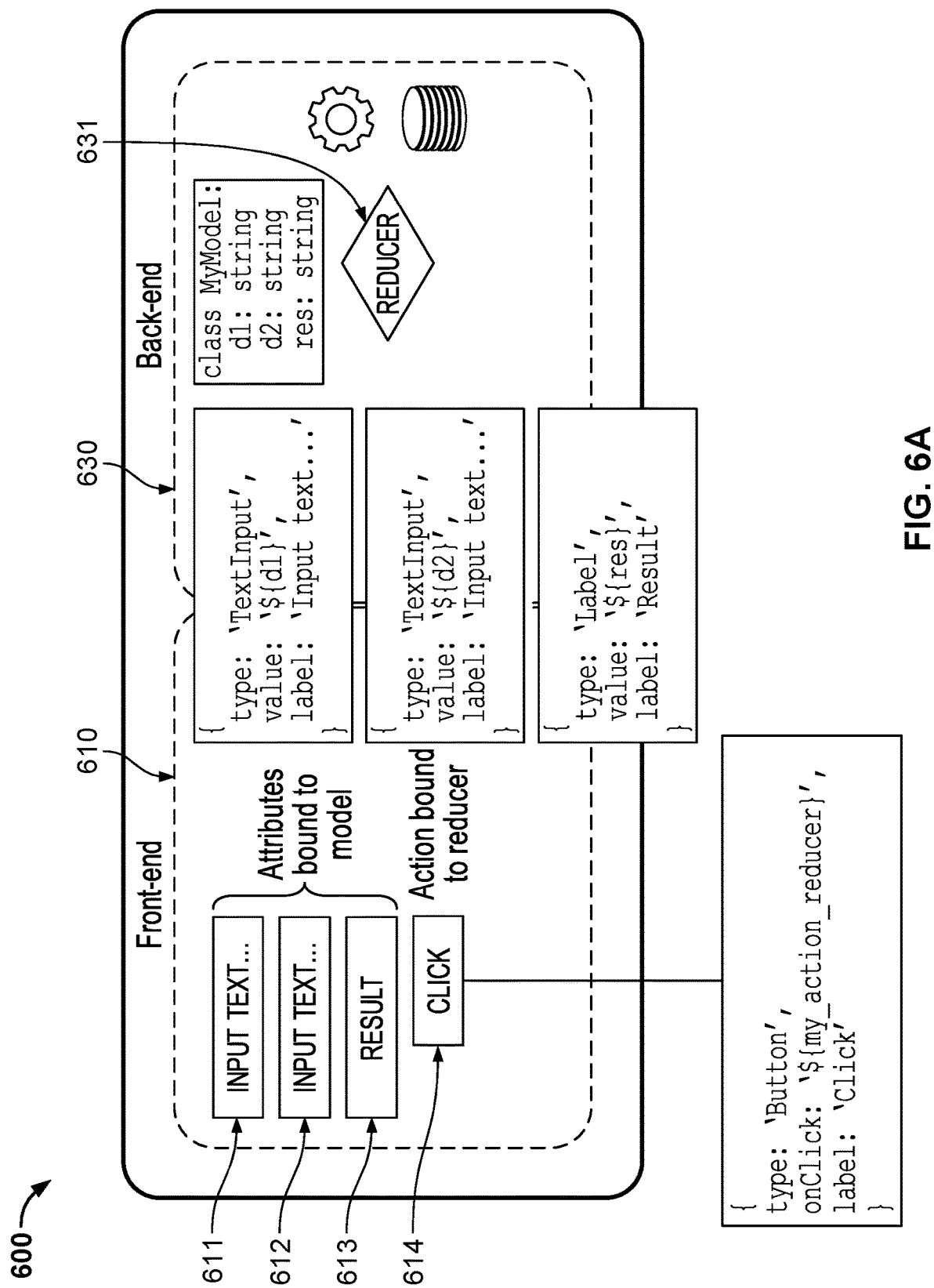
FIGS. 6A and 6B illustrate a flow of actions between components of a frontend and a backend of a building block.
Figure 6B:
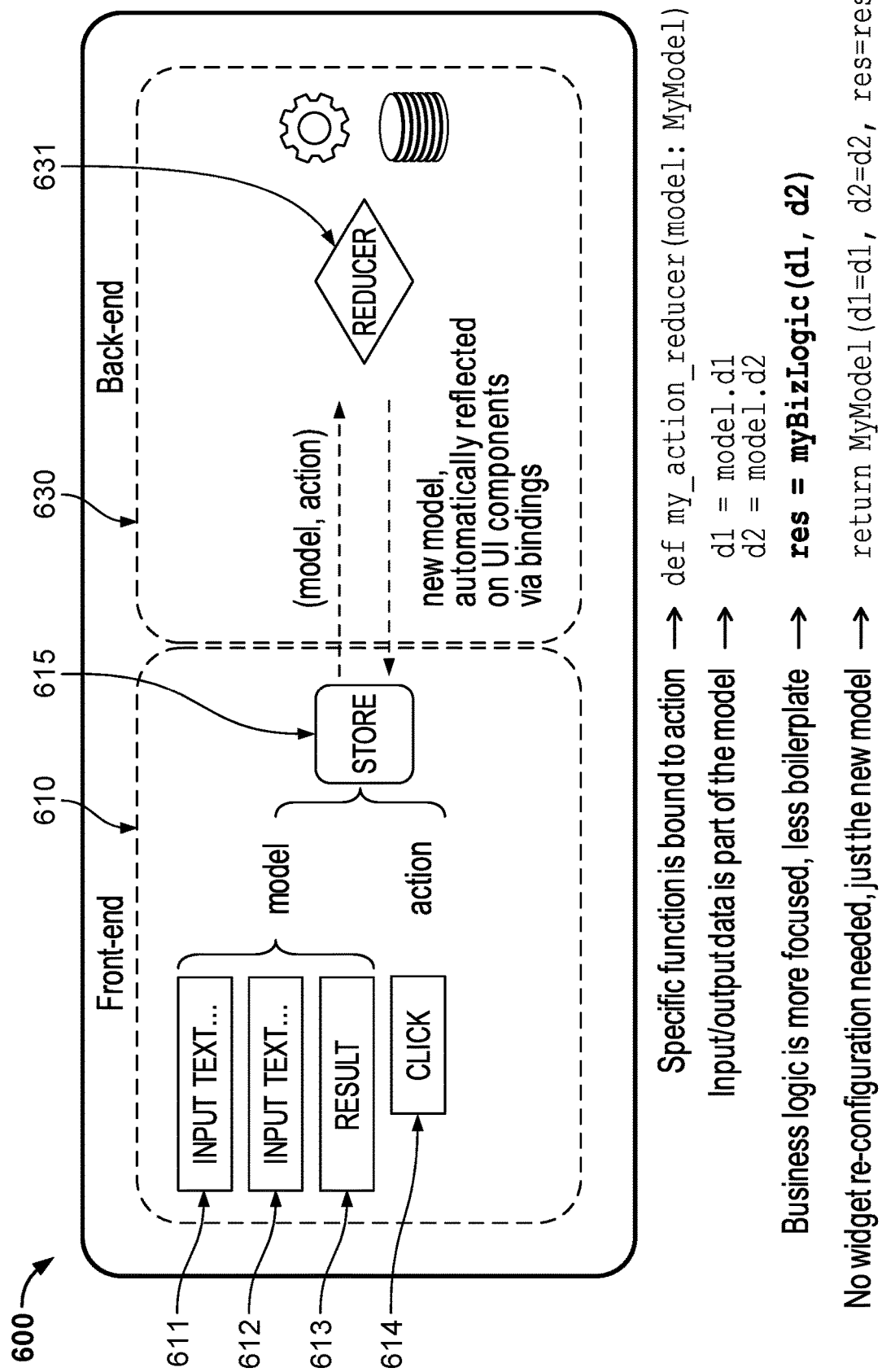

FIGS. 6A and 6B illustrate a flow of actions between components of a frontend 610 and a backend 630 of a building block 600. For example, the building block 600 can be a business component or a page. The frontend 610 can be a micro frontend. The frontend 610 includes a store 615 and user interface components 611-614. The user interface components include two input text elements 611 and 612, a result element 613, and a click button 614. Each of the user interface components 611-613 include attributes that are bound, e.g., using declarative binding, to the model for the frontend 610. The click button 614 includes an action that is bound, e.g., using declarative binding, to the reducer function 631 of the backend.

When the button 614 is selected, the store 615 receives, from the button, action data specifying that the button 614 was selected. Based on the binding, the store 615 sends the action data to the reducer 631 to which the action is bound. The store 615 also sends the current model to the reducer function 631. The model includes the attributes of the user interface components 611-613. The reducer function 631 generates an updated model based on the received model and the action data. The updated model is automatically reflected on the user interface components 611-613 via the bindings between the attributes and the model. That is, the user interface components 611-613 will present the attributes of the updated model in response to the store 615 receiving the updated model from the reducer function 631 due to the bindings.

Figure 7:
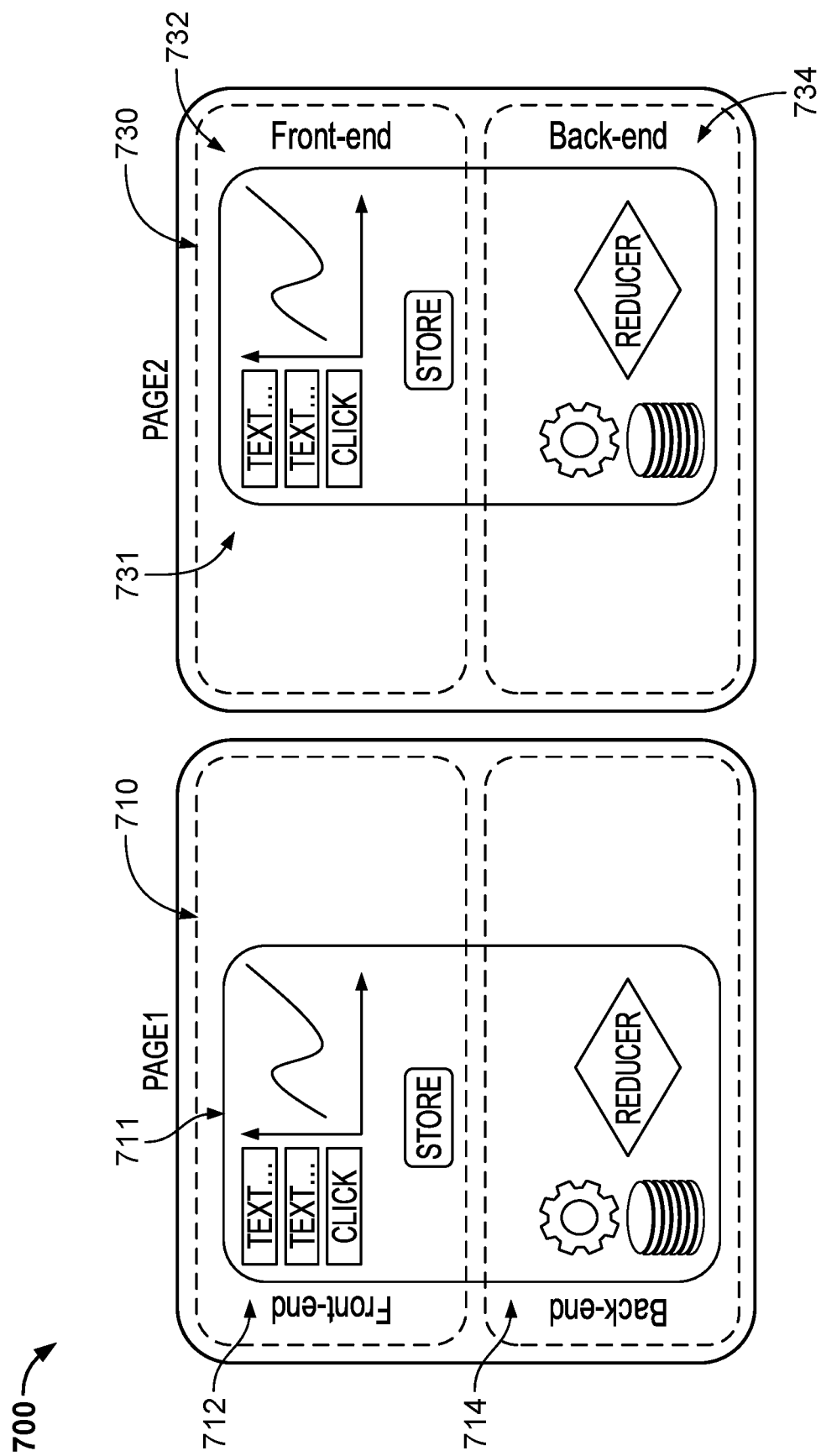
FIG. 7 is a diagram illustrating a flow of actions between components of frontends and backends of building blocks.

FIG. 7 is a diagram illustrating a flow of actions between components of frontends and backends of building blocks 711 and 731. The building blocks 711 and 731 can be business components of pages 710 and 730, respectively. Each building block 711 and 731 has its own frontend and backend that communicate with each other. This enables developers to vertically slice an application and maximizes code reuse. The building blocks 711 and 731 are structured like micro-pages that can cooperate with each other, e.g., using messages. The page code is minimized and becomes optional as each building block can act as an independent unit. This is in contrast to fronted monoliths that requires the duplication of page logic for managing groups of widgets and glue code with the rest of the page-specific business logic, which easily became messy and difficult for developers to manage, e.g., across multiple teams. The duplication of code in frontend monoliths also hinders non-code and low-code approaches.

Figure 8:
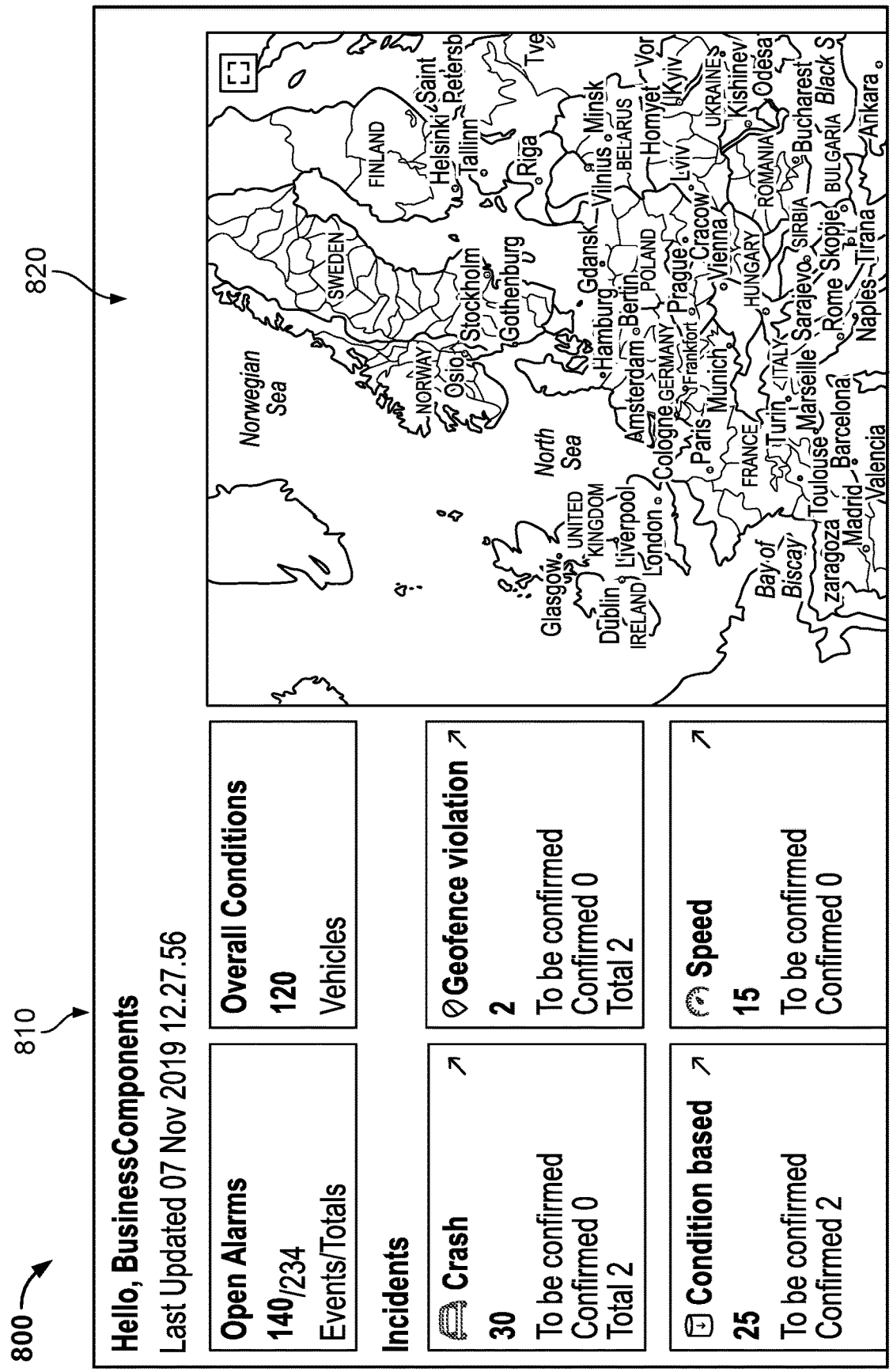
FIG. 8 is a diagram illustrating an example user interface generated using building blocks.

FIG. 8 is a diagram illustrating an example user interface 800 generated using building blocks. For example, the user interface 800 can be generated based on a summary display component and a map component being placed into the configuration user interface 120 of FIG. 1 and connected together. The user interfaces 800 includes a summary display element 810 that displays a summary of data for a geographic area displayed by a map display element 820.

The summary display element 810 can be implemented as a business component that includes a user interface component for each piece of data shown in the summary. For example, the business component can include a user interface component for open alarms, a user interface component for overall conditions, etc. Each user interface component can include an attribute that it presents and each attribute can be bound to the model for the summary display element 810. In this way, when the model is updated, the attributes displayed by the summary display element are also updated.

The map display element 820 can also be implemented as a business component that includes a map as a user interface component. The micro frontend of the map display element 820 can be bound to the micro frontend of the summary display element. When the geographic area shown by the map changes, e.g., due to zooming or scrolling in a particular direction, the micro frontend of the map display element 820 can send a message to the micro frontend of the summary display element 810. The message can include action data specifying that the geographic area has changed and data specifying the updated geographic area that is visible in the map display element 820.

The store of the summary display element 810 can send a current model and the action data to a reducer function that generates an updated model based on the current model and the action data. The reducer function can provide the updated model to the store of the summary display element 810, which can update the user interface components, e.g., the open alarms component, to present its updated attributed of the updated model.

Figure 9:
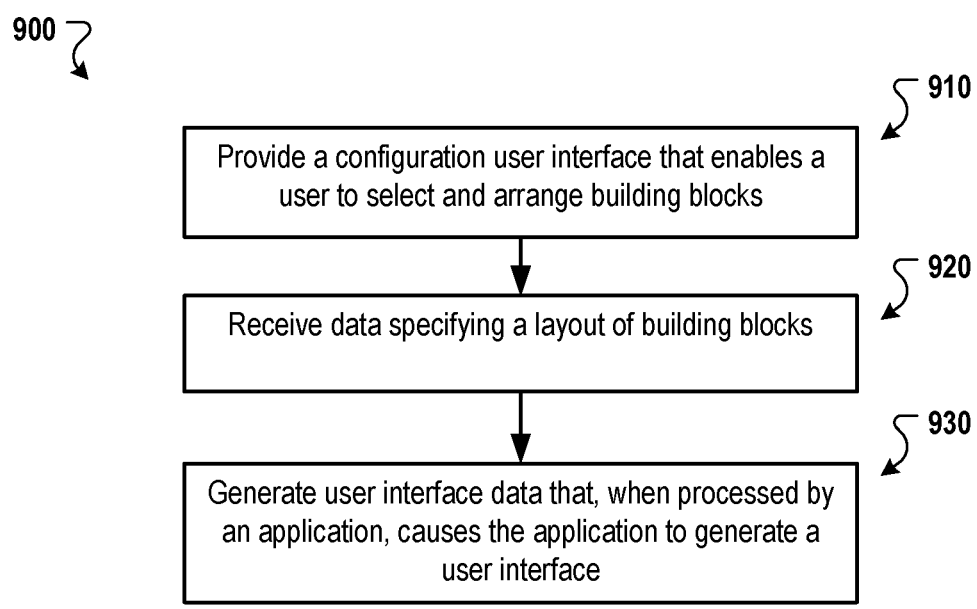
FIG. 9 is a flow chart of an example process for developing an application using building blocks that include micro frontends.

FIG. 9 is a flow chart of an example process 900 for developing an application using building blocks that include micro frontends. The process 900 can be performed by the application development system 110. Operations of the process 900 can also be implemented as instructions stored on non-transitory computer readable media, and execution of the instructions by one or more data processing apparatus can cause the one or more data processing apparatus to perform the operations of the process 900.

A configuration user interface is provided (910). The application development system 110 can provide a configuration user interface that enables a user, e.g., an application developer, to arrange building blocks in a layout within the configuration user interface. For example, the configuration user interface can enable a user to drag and drop building blocks in the configuration user interface from a menu of configured building blocks. The application development system 110 can provide the configuration user interface to a client device of the user.

The layout corresponds to how the user interface components of the micro frontends of the building blocks will be presented on a page generated based on the arrangement. For example, the building blocks shown within the configuration user interface can show the user interface components of the building blocks the same as, or similar to, how the user interface components will be shown on the page.

The configuration user interface also enables the user to define the communications between the building blocks, e.g., between the micro frontends of the building blocks. In some implementations, the configuration user interface enables the user to connect two building blocks that are to communicate with each other when presented on a page by an application, e.g., by a web browser or native application. In some implementations, a menu can be used to select, for each building block, which other building blocks the building block will receive messages, e.g., messages that define actions. The user can define the particular instance of the building block that will receive messages from another instance of another building block as there can be multiple instances of the same building block on a page. In addition, the configuration user interface can enable a user to specify the types of messages that a building block is to receive from another building block as some building blocks may output multiple different types of messages with different actions or other data.

Data specifying a layout of building blocks is received (920). After arranging building blocks within the configuration user interface and defining the communications between the building blocks, the user can save the layout. In response, the client device can send data defining the layout to the application development system 110. This data can specify the building blocks in the layout, the arrangement (e.g., relative positions) of the building blocks within the layout, and the communications defined by the user.

User interface data is generated based on the data specifying the layout of the building blocks (930). The application development system 110 can generate the user interface data based on the data specifying the layout of building blocks and an application that will present the user interface. The user interface data can include code that, when processed by an application such as a web browser or native application, causes the application to generate a user interface (e.g., page) that presents the user interface components of the micro frontends of the building blocks in the arrangement defined by the user.

For a web page, the application development system 110 can generate Hypertext Markup Language (HTML) code, cascaded style sheets (CSS), JavaScript, and/or other appropriate code that presents the user interface elements of the micro frontends. For example, the application development system 110 can generate an HTML document that registers each of the micro frontends of the building blocks in the layout. In this example, when a web browser loads the HTML document, the web browser will process the code of the micro frontends and present the user interface components of the micro frontends within the web page represented by the HTML document. The application development system 110 can also generate declarative bindings that define the communications between the micro frontends of the page.

The user can then provide the user interface data for presentation in applications on other devices. For example, the user can load an HTML document for a web page on a website for other users to download using a web browser. These web browsers can process the code in the HMTL document and present the web page represented by the HTML document.

The micro frontends can communicate based on the declarative bindings and send messages to their respective backends in response to actions. For example, if a user interacts with the user interface component of a micro frontend presented by a web browser, the micro frontend can send obtain a current model for the micro frontend from its store and send the model and data specifying the action to its backend. The backend can use its reduced function to update the model and send the updated model to the micro frontend being presented by the web browser. In turn, the micro frontend can update its user interface component, e.g., to display different content, based on the updated model.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them. The computer storage medium is not, however, a propagated signal.

The term "data processing apparatus" refers to data processing hardware and encompasses all kinds of apparatus, devices, and machines for processing data, including by way of example a programmable processor, a computer, or multiple processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the user device, which acts as a client. Data generated at the user device, e.g., a result of the user interaction, can be received from the user device at the server.

Figure 10:
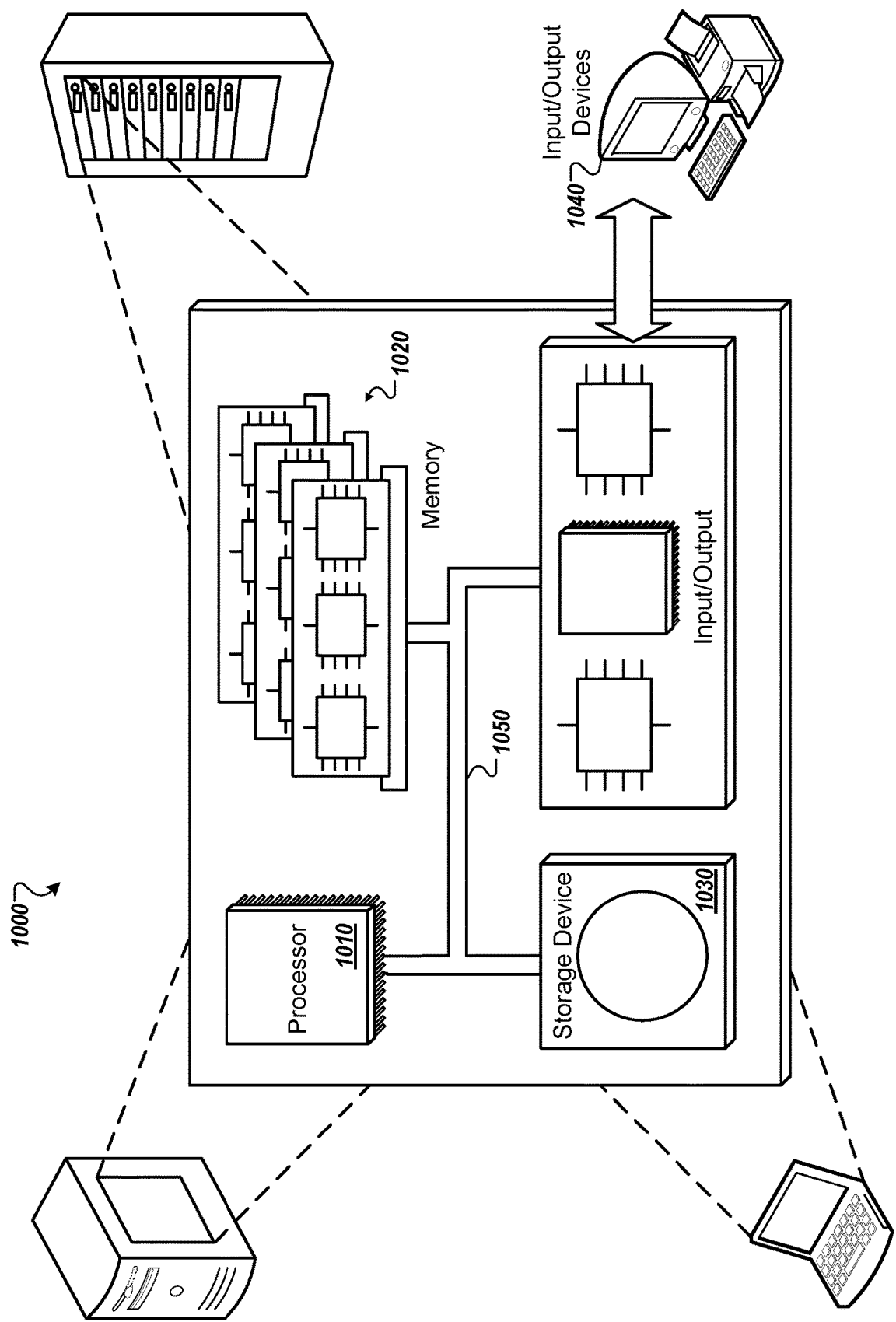
FIG. 10 is a schematic diagram of a computer system.

An example of one such type of computer is shown in FIG. 10, which shows a schematic diagram of a generic computer system 1000. The system 1000 can be used for the operations described in association with any of the computer-implemented methods described previously, according to one implementation. The system 1000 includes a processor 1010, a memory 1020, a storage device 1030, and an input/output device 1040. Each of the components 1010, 1020, 1030, and 1040 are interconnected using a system bus 1050. The processor 1010 is capable of processing instructions for execution within the system 1000. In one implementation, the processor 1010 is a single-threaded processor. In another implementation, the processor 1010 is a multi-threaded processor. The processor 1010 is capable of processing instructions stored in the memory 1020 or on the storage device 1030 to display graphical information for a user interface on the input/output device 1040.

The memory 1020 stores information within the system 1000. In one implementation, the memory 1020 is a computer-readable medium. In one implementation, the memory 1020 is a volatile memory unit. In another implementation, the memory 1020 is a non-volatile memory unit.

The storage device 1030 is capable of providing mass storage for the system 1000. In one implementation, the storage device 1030 is a computer-readable medium. In various different implementations, the storage device 1030 may be a floppy disk device, a hard disk device, an optical disk device, or a tape device.

The input/output device 1040 provides input/output operations for the system 1000. In one implementation, the input/output device 1040 includes a keyboard and/or pointing device. In another implementation, the input/output device 1040 includes a display unit for displaying graphical user interfaces.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by one or more data processing apparatus, the method comprising:
provided a configuration user interface that enables a user to select and arrange building block user interface elements in a layout for a page;
receiving, from the configuration user interface, data specifying a layout of building block user interface elements that each include a micro frontend and corresponding backend logic, wherein:
each micro frontend includes one or more user interface components that are displayed on the page when the page is rendered and a store that manages a model that represents a state of the one or more user interface components of the micro frontend; and
the corresponding backend logic for each micro frontend includes a function that is configured to (i) update the model of the micro frontend based on a previous model received from the micro frontend and an action received from the micro frontend and (ii) provide the updated model to the micro frontend; and
generating user interface data that, when processed by an application, causes the application to generate the page that presents the one or more user interface components of each of the building block user interface elements in the layout specified by the received data, the generating comprising:
generating, based at least in part on the layout of the building block user interface elements, (i) respective declarative bindings between each micro frontend and the corresponding backend logic for the micro front end and (ii) respective declarative bindings between micro frontends of each group of two or more building blocks that are configured, by the user, to communicate with each other micro frontend in the group when the page is rendered.

2. The method of claim 1, further comprising:
receiving data specifying that a first building block user interface element is a subscriber to messages generated by a second building block user interface element; and
generating a declarative binding between the first building block user interface element and the second building block user interface element.

3. The method of claim 1, wherein the corresponding backend logic of each building block user interface element comprises one or more reducer functions.

4. The method of claim 3, wherein a given user interface component of each building block user interface element comprises a corresponding action that is bound to a corresponding reducer function of the corresponding backend logic of the building block user interface element.

5. The method of claim 4, wherein the store of each micro frontend is configured to send a current model maintained by the store and action data specifying a detected action to the corresponding reducer function in response to detecting the action.

6. The method of claim 5, wherein each reducer function is configured to generate an updated model based on the current model and action data and provide the updated model to the store.

7. The method of claim 1, wherein each of the one or more user interface components is bound to a respective attribute of the model.

8. The method of claim 7, further comprising updating the one or more user interface components in response to receiving an updated model that includes updated attributes.

9. The method of claim 1, further comprising receiving data defining custom business logic for the user interface.

10. The method of claim 1, wherein generating the user interface data comprises:
detecting, in the layout of the building block user interface elements, a connection between a first building block user interface element and a second building block user interface element; and
in response to detecting the connection between the first building block user interface element and the second building block user interface element, enabling communication between the first building block user interface element and the second building block user interface element by generating a declarative binding between a first micro frontend of the first building block user interface element and a second micro frontend of the second building block user interface element.

11. The method of claim 1, wherein the corresponding backend logic for at least one micro frontend included in the layout of building block user interface elements runs on a different server than the corresponding backend logic for at least one other micro frontend included in the layout of building block user interface elements.

12. A system, comprising:
one or more computers; and
one or more computer memory devices interoperably coupled with the one or more computers and having tangible, non-transitory, machine-readable media storing one or more instructions that, when executed by the one or more computers, perform operations comprising: providing a configuration user interface that enables a user to select and arrange building block user interface elements in a layout for a page;
receiving, from the configuration user interface, data specifying a layout of building block user interface elements that each include a micro frontend and corresponding backend logic, wherein:
each micro frontend includes one or more user interface components that are displayed on the page when the page is rendered and a store that manages a model that represents a state of the one or more user interface components of the micro frontend; and
the corresponding backend logic for each micro frontend includes a function that is configured to (i) update the model of the micro frontend based on a previous model received from the micro frontend and an action received from the micro frontend and (ii) provide the updated model to the micro frontend; and
generating user interface data that, when processed by an application, causes the application to generate the page that presents the one or more user interface components of each of the building block user interface elements in the layout specified by the received data, the generating comprising:
generating, based at least in part on the layout of the building block user interface elements, (i) respective declarative bindings between each micro frontend and the corresponding backend logic for the micro front end and (ii) respective declarative bindings between micro frontends of each group of two or more building blocks that are configured, by the user, to communicate with each other micro frontend in the group when the page is rendered.

13. The system of claim 12, wherein the corresponding backend logic of each building block user interface element comprises one or more reducer functions.

14. The system of claim 13, wherein a given user interface component of each building block user interface element comprises a corresponding action that is bound to a corresponding reducer function of the corresponding backend logic of the building block user interface element.

15. The system of claim 14, wherein the store of each micro frontend is configured to send a current model maintained by the store and action data specifying a detected action to the corresponding reducer function in response to detecting the action.

16. The system of claim 15, wherein each reducer function is configured to generate an updated model based on the current model and action data and provide the updated model to the store.

17. The system of claim 12, wherein each of the one or more user interface components is bound to a respective attribute of the model.

18. The system of claim 17, wherein the operations comprise updating the one or more user interface components in response to receiving an updated model that includes updated attributes.

19. The system of claim 12, wherein the operations comprise receiving data defining custom business logic for the user interface.

20. The system of claim 12, wherein the operations comprise:
receiving data specifying that a first building block user interface element is a subscriber to messages generated by a second building block user interface element; and
generating a declarative binding between the first building block user interface element and the second building block user interface element.

21. A non-transitory, computer-readable medium storing one or more instructions executable by a computer system to perform operations comprising:
providing a configuration user interface that enables a user to select and arrange building block user interface elements in a layout for a page;
receiving, from the configuration user interface, data specifying a layout of building block user interface elements that each include a micro frontend and corresponding backend logic, wherein:
each micro frontend includes one or more user interface components that are displayed on the page when the page is rendered and a store that manages a model that represents a state of the one or more user interface components of the micro frontend; and
the corresponding backend logic for each micro frontend includes a function that is configured to (i) update the model of the micro frontend based on a previous model received from the micro frontend and an action received from the micro frontend and (ii) provide the updated model to the micro frontend; and
generating user interface data that, when processed by an application, causes the application to generate the page that presents the one or more user interface components of each of the building block user interface elements in the layout specified by the received data, the generating comprising:
generating, based at least in part on the layout of the building block user interface elements, (i) respective declarative bindings between each micro frontend and the corresponding backend logic for the micro front end and (ii) respective declarative bindings between micro frontends of each group of two or more building blocks that are configured, by the user, to communicate with each other micro frontend in the group when the page is rendered.

* * * * *